United States Patent
Ishibashi et al.

(10) Patent No.: US 9,140,736 B2
(45) Date of Patent: Sep. 22, 2015

(54) FILM SENSOR

(71) Applicant: NITTO DENKO CORPORATION, Ibaraki, Osaka (JP)

(72) Inventors: Kuniaki Ishibashi, Ibaraki (JP); Akiko Sugino, Ibaraki (JP); Tsuyoshi Chiba, Ibaraki (JP); Masakuni Fujita, Ibaraki (JP); Takashi Yamaoka, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 136 days.

(21) Appl. No.: 13/677,754

(22) Filed: Nov. 15, 2012

(65) Prior Publication Data

US 2013/0120006 A1    May 16, 2013

(30) Foreign Application Priority Data

Nov. 16, 2011    (JP) ................. 2011-250903

(51) Int. Cl.
  *G01R 27/26* (2006.01)
  *G06F 3/041* (2006.01)
  *G01R 31/312* (2006.01)
  (Continued)

(52) U.S. Cl.
  CPC .............. *G01R 27/2605* (2013.01); *G01D 5/24* (2013.01); *G01R 31/312* (2013.01); *G06F 3/041* (2013.01); *G06F 3/044* (2013.01); *G06F 2203/04103* (2013.01)

(58) Field of Classification Search
  CPC .. G01R 27/26; G01R 27/2605; G01R 31/016; G01R 31/312; G01D 5/24; G08B 13/26; G06F 3/044; G06F 3/0488; G06K 9/0002; H03K 17/955
  USPC ......... 324/686, 658, 649, 600, 519, 548, 661; 702/47, 52; 361/271, 306.3, 502, 562; 345/174, 173
  See application file for complete search history.

(56) References Cited

U.S. PATENT DOCUMENTS

| 8,717,518 B2 | 5/2014 | Kim et al. |
| 2005/0253598 A1* | 11/2005 | Kawahata .................. 324/671 |

(Continued)

FOREIGN PATENT DOCUMENTS

| CN | 102043184 A | 5/2011 |
| CN | 1022207786 A | 10/2011 |

(Continued)

OTHER PUBLICATIONS

Korean Office Action dated Jan. 29, 2014, issued in corresponding Korean Patent Application No. 10-2012-0116122, w/English translation (7 pages).

(Continued)

*Primary Examiner* — Hoai-An D Nguyen
(74) *Attorney, Agent, or Firm* — Westerman, Hattori, Daniels & Adrian, LLP

(57) ABSTRACT

A film sensor includes a polarizing film, an antistatic layer and a capacitive sensor that are laminated in this order, the capacitive sensor having a transparent film, a transparent electrode pattern formed on one side of the transparent film, and an adhesive layer formed on the one side of the transparent film to embed the transparent electrode pattern. The transparent film is disposed between the antistatic layer and the transparent electrode pattern. The antistatic layer has a surface resistance value of $1.0\times10^9$ to $1.0\times10^{11} \Omega/\square$.

5 Claims, 1 Drawing Sheet

(51) Int. Cl.
  *G01D 5/24* (2006.01)
  *G06F 3/044* (2006.01)

(56) References Cited

U.S. PATENT DOCUMENTS

| | | | |
|---|---|---|---|
| 2009/0153509 A1* | 6/2009 | Jiang et al. | 345/173 |
| 2010/0033196 A1* | 2/2010 | Hayakawa et al. | 324/686 |
| 2010/0080967 A1 | 4/2010 | Hu et al. | |
| 2011/0076464 A1* | 3/2011 | Elschner et al. | 428/195.1 |
| 2011/0080358 A1* | 4/2011 | Park et al. | 345/173 |
| 2011/0228188 A1 | 9/2011 | Kim et al. | |
| 2011/0235230 A1 | 9/2011 | Lee et al. | |
| 2011/0267305 A1* | 11/2011 | Shahparnia et al. | 345/174 |
| 2013/0056244 A1* | 3/2013 | Srinivas et al. | 174/250 |

FOREIGN PATENT DOCUMENTS

| | | |
|---|---|---|
| JP | 2003-320556 A | 11/2003 |
| JP | 2010-277461 A | 12/2010 |
| JP | 2011-081810 A | 4/2011 |
| JP | 2011-173984 A | 9/2011 |
| JP | 5306059 B2 | 10/2013 |
| KR | 10-2010-0009510 | 1/2010 |
| KR | 10-2011-0039182 | 4/2011 |
| KR | 10-2011-0105613 A | 9/2011 |
| TW | 201128242 A1 | 8/2011 |

OTHER PUBLICATIONS

Korean Office Action dated Sep. 29, 2014, issued in corresponding Korean Application No. 10-2012-0116122; w/English Translation. (8 pages).

Taiwanese Office Action dated Sep. 19, 2014, issued in corresponding Taiwanese Application No. 101142702; w/ English Translation. (8 pages).

Office Action dated May 25, 2015, issued in corresponding Japanese Application No. 2011-250903(9 pages).

Approval Decision dated May 4, 2015, issued in corresponding Chinese Patent Application No. 101142702, with English translation (5 pages).

Decision of Refusal dated May 29, 2015, issued in corresponding Korean Patent Application No. 10-2012-0116122, with English translation (8 pages).

Office Action dated May 29, 2015, issued in counterpart Chinese application No. 201210424863.2 (English translation of abstract included) (15 pages).

* cited by examiner

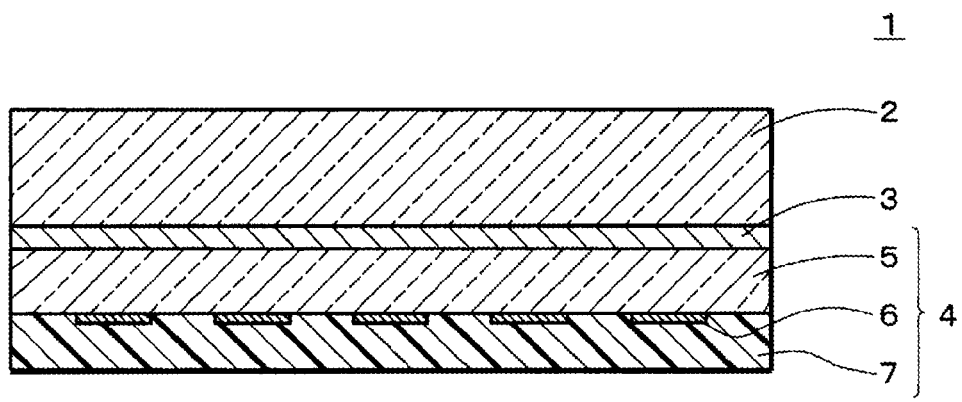
F I G. 1
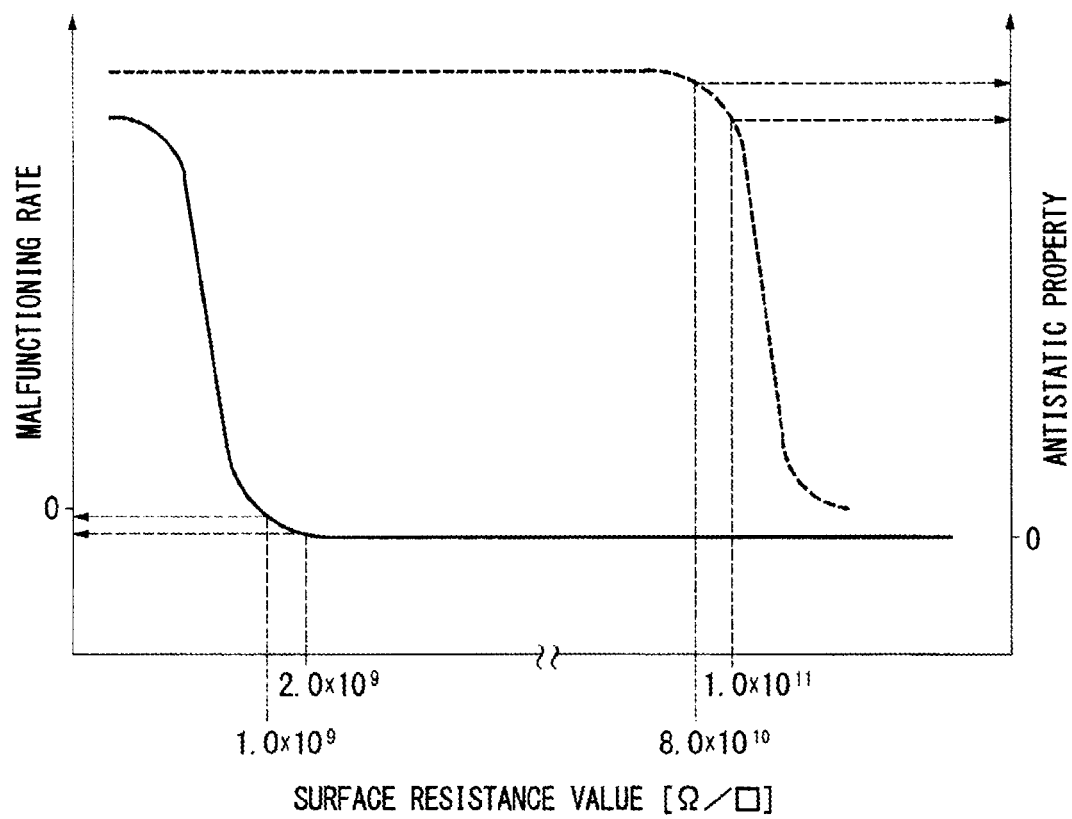
F I G. 2

FILM SENSOR

CROSS REFERENCE TO RELATED APPLICATIONS

This application claims the benefit of Japanese Application No. 2011-250903, filed Nov. 16, 2011, which is hereby incorporated by reference herein in its entirety.

BACKGROUND OF INVENTION

1. Field of the Invention

The present invention relates to a film sensor that is applied to an input display device capable of inputting information by a touch with a finger, a stylus pen or the like.

2. Background of the Invention

In the related art, a film sensor provided with a capacitive sensor on one side of a polarizing film is known (Japanese Laid-Open Patent Application (Kokai) No. 2011-081810). Such a film sensor includes a conductive film provided with a conductive layer on an upper surface thereof, an adhesive agent layer provided on the conductive layer, and a polarizing film provided on the adhesive agent layer. By affixing such a film sensor to, for example, a surface of a liquid crystal panel, an input display device with an improved viewability can be obtained.

However, with the film sensor of the related art, a polarizing film or the like is charged with static electricity, malfunctioning may occur in the capacitive sensor.

SUMMARY OF INVENTION

An object of the invention is to provide a film sensor capable of preventing occurrence of the malfunctioning while providing an improved visibility and also prevent a display defect for a long period of time by exerting an improved antistatic property.

In order to achieve the above object, according to an aspect of the invention, a film sensor includes a polarizing film, an antistatic layer and a capacitive sensor that are laminated in this order, the capacitive sensor having a transparent film, a transparent electrode pattern formed at one side of the transparent film, and an adhesive layer formed at the one side of the transparent film to embed the transparent electrode pattern, the transparent film being disposed between the antistatic layer and the transparent electrode pattern, the antistatic layer having a surface resistance value of $1.0 \times 10^9$ to $1.0 \times 10^{11} \Omega/\square$.

Preferably, the antistatic layer and the adhesive layer are disposed at a predetermined interval with the transparent film being interposed between the antistatic layer and the adhesive layer.

Preferably, after the adhesive layer has been formed at the one side of the transparent film, the antistatic layer is formed at the other side of the transparent film.

Further, the antistatic layer includes any one of a surface active agent, an alkaline metal salt, a polyhydric alcohol, a conductive fine particle and a conductive polymer, and further preferably, the alkaline metal salt is bis(trifluoroalkanesulfonyl)imide alkaline metal salt.

According to the invention, the transparent film is disposed between the antistatic layer and the transparent electrode pattern, and the antistatic layer has a surface resistance value of $1.0 \times 10^9$ to $1.0 \times 10^{11} \Omega/\square$. By making the surface resistance value of the antistatic layer to be within the aforementioned range, the charging of the polarizing film due to static electricity or the like can be suppressed. Further, the capacitive sensor can accurately sense a change in a capacitance produced between the transparent electrode pattern and the user's finger. Further, with such an arrangement, since the antistatic layer does not come into contact with the adhesive layer, it is possible to prevent diffusion of components contained in the antistatic layer, and an antistatic function is maintained for a long period of time. Therefore, it is possible to prevent occurrence of the malfunctioning while providing an improved visibility and also prevent a display defect for a long period of time by exerting an improved antistatic property. As a result, it is possible to provide a film sensor in which a proper operation continues for a long period of time.

Further features of the present invention will become apparent from the following detailed description of exemplary embodiments with reference to the attached drawings.

BRIEF DESCRIPTION OF DRAWINGS

FIG. 1 is a cross-sectional view schematically showing a configuration of a film sensor of an embodiment of the invention.

FIG. 2 is a diagram showing a relationship between a surface resistance value of an antistatic layer of FIG. 1 and each of malfunctioning and antistatic property (display defect) occurring in the film sensor.

DETAILED DESCRIPTION

Hereinafter, embodiments of the invention will be described in detail with reference to the drawings.

FIG. 1 is a cross-sectional view schematically showing a configuration of a film sensor of the present embodiment. In FIG. 1, a thickness of each layer is shown by way of example, and the thickness of each layer of the film sensor of the invention is not limited to the thickness shown in FIG. 1.

As shown in FIG. 1, the film sensor 1 of the invention is comprised of a polarizing film 2, an antistatic layer 3 and a capacitive sensor 4 in this order. The capacitive sensor has a transparent film 5, a transparent electrode pattern 6 formed on one side of the transparent film, and an adhesive layer 7 formed on one side of the transparent film 5 to embed the transparent electrode pattern.

The antistatic layer 3 is disposed between the polarizing film 2 and the transparent film 5, and is attached to the transparent film 5. The antistatic layer 3 has a surface resistance value of $1.0 \times 10^9$ to $1.0 \times 10^{11} \Omega/\square$ (ohms per square). The transparent film 5 is disposed between the antistatic layer 3 and the transparent conductor pattern 6. With the transparent film 5 being interposed between the antistatic layer 3 and the adhesive layer 7, the antistatic layer 3 and the adhesive layer 7 are spaced apart by a thickness of the transparent film 5.

Generally, the capacitive sensor detects, when the user's finger approaches its surface, a weak capacitance formed by the transparent electrode pattern and the finger. Here, when a polarizing film in which static electricity is built is provided between the transparent electrode pattern and the finger, malfunctioning may occur in the capacitive sensor. On the other hand, in order to reduce charging of the polarizing film, if a layer with a good electric conductivity (e.g., a conductive layer having a surface resistance value of less than $1.0 \times 10^9 \Omega/\square$) is provided between the transparent electrode pattern and the user's finger, there may be a problem that a desired capacitance cannot be obtained in the capacitive sensor.

The present inventors have carried out assiduous studies to attain the above object, and, as a result, focused on the surface resistance value of the antistatic layer and a position where the antistatic layer is disposed. As a result, the present inventors have reached the findings that an improved antistatic property can be achieved while preventing the malfunctioning of the capacitive sensor by setting the surface resistance value of the antistatic layer to a specific value.

Further, the present inventor have reached the findings that, with the transparent film being disposed between the antistatic layer and the transparent electrode pattern, an improved antistatic property can be maintained for a long period of time. Unlike the film sensor of the related art, since the transparent film is not in contact with an adhesive layer that embeds the transparent electrode pattern, even in a case where the antistatic layer is disposed adjacent to the polarizing film, its component (typically, an antistatic agent) can be prevented from being dispersed into the adhesive layer.

Hereinafter, details of each constituent element of the film sensor 1 will be described.

(Polarizing Film)

A polarizing film used in the invention has a function of separating light which is input to the polarizing film into two polarized components that are mutually orthogonal, transmitting one of the polarized components and absorbing the other one of the polarized components. The polarizing film has an absorption axis and a transmission axis that are lying in a plane. The absorption axis lies in a direction in which absorption of an incident light is maximized and the transmission axis lies in a direction in which transmission of the light is maximized. Generally, the absorption axis and the transmission axis are mutually orthogonal.

The polarizing film is preferably a stretched film of polyvinyl alcohol resin containing a dichroic element, but not particularly limited thereto as long as it has the aforementioned function. Also, the aforementioned polarizing film may be constituted by laminating protection films on both sides of the stretched film. Generally, the stretched film has a thickness of 1.0 μm to 30 μm. Such a polarizing film is available from, for example, Nitto Denko Corporation.

(Antistatic Layer)

The antistatic layer used in the invention is disposed between the polarizing film and the capacitive sensor. The antistatic layer has a thickness of, for example, 0.1 μm to 80 μm. The antistatic layer has a surface resistance value per unit area of $1.0\times10^9$ to $1.0\times10^{11}\Omega/\square$ (ohms per square). When the surface resistance value of the antistatic layer is less than $1.0\times10^9\Omega/\square$, malfunctioning of the capacitive sensor occurs, and on the other hand, when the surface resistance value exceeds $1.0\times10^{11}\Omega/\square$, a display defect occurs. By using such an antistatic layer, the film sensor of the invention can exert an improved antistatic property while preventing malfunctioning in the capacitive sensor.

The antistatic layer is made of a material having, for example, an acrylic resin as its main component and preferably contains an antistatic agent. The antistatic layer may be formed by affixing a pressure sensitive adhesive (PSA), in which an antistatic agent is dispersed, to the polarizing film, or formed by applying the antistatic agent to the polarizing film by mixing the antistatic agent into an arbitrary coating agent or a solvent, or directly without dilution. When the antistatic layer is formed by applying the antistatic agent, another adhesive layer is additionally provided between such an antistatic layer and the capacitive sensor.

The antistatic layer preferably contains any one of an alkaline metal salt, a surface active agent, a polyhydric alcohol, conductive fine particles and a conductive polymer, and further preferably contains bis(trifluoroalkanesulfonyl)imide alkaline metal salt as the alkaline metal salt. The antistatic layer is, for example, available from Tokyo Chemical Industry Co., Ltd.

The surface active agent may be an anionic or amphoteric surface active agent such as a sulfonic acid compound or a non-ionic surface active agent such as ethylene oxide. The polyhydric alcohol may be an esterification reactant such as polyethylene glycol. The conductive fine particles may be conductive carbon black (CB) or carbon nanotubes (CNTs). The conductive polymer may be polyaniline, polyethylenedioxythiophene or polypyrrole.

The surface resistance value of the antistatic layer can be increased or decreased, where appropriate, by changing a type or an amount of content of the antistatic agent.

(Capacitive Sensor)

The capacitive sensor used in the invention has a transparent film which is optically isotropic, a transparent electrode pattern provided on one side of the transparent film, and an adhesive layer provided on the one side of the transparent substrate so as to embed the transparent electrode pattern.

The transparent electrode pattern is, in general, electrically connected to a wiring (not shown) formed at an edge portion of the transparent substrate.

According to the invention, the transparent film is disposed between the antistatic layer and the transparent electrode pattern. With such a configuration, since the polarizing film and the adhesive layer that embeds the transparent electrode pattern are not in contact, even in a case where the antistatic layer is laminated adjacent to the polarizing film, a component (typically, an antistatic agent) of the antistatic layer can be prevented from being diffused into the adhesive layer. As a result, the film sensor of the invention is capable of maintaining an improved antistatic property for a long period of time.

The transparent film is preferably optically isotropic or has an in-plane phase difference value of $\lambda/4$ for any wavelength $\lambda$ in a visible light range (380 nm to 780 nm). In a case where the transparent film is optically isotropic, an in-plane phase difference value of such a transparent film for a wavelength 590 nm is, preferably, less than 10 nm. In a case where the transparent film has an in-plane phase difference value of $\lambda/4$ for any wavelength $\lambda$ in the visible light range, an in-plane phase difference value of such a transparent film at a wavelength 590 nm is preferably 127.5 nm to 167.5 nm (590/4=147.5 nm (allowance±20 nm)).

A material forming the transparent film is, preferably, polycycloolefin or polycarbonate, since it has a good thermal resistance. The transparent film has a thickness of, for example, 10 μm to 200 μm. The transparent film may be provided with an easy adhesion layer or a hard coat layer on its surface. The transparent film is, for example, available from ZEON CORPORATION and Teijin Chemicals Ltd.

The transparent electrode pattern is typically made of a transparent conductor. The transparent conductor is a material that has a transmissivity of greater than or equal to 80% in a visible light region (380 nm 780 nm) and a surface resistance value of less than or equal to $500\Omega/\square$. Preferably, the transparent conductor is made of indium tin oxide, indium zinc oxide, or a composite oxide of indium oxide-zinc oxide.

The shape of the transparent electrode pattern is not limited to a comb shape, and any shape such as a striped shape or a diamond shape may be employed depending on the use. The transparent electrode pattern has a height of, for example, 10 nm to 100 nm and a width of 0.1 mm to 5.0 mm.

The transparent electrode pattern can be obtained by forming a transparent conductor layer on a transparent film through, for example, a sputtering method or a vacuum deposition method, thereafter forming a photoresist of a desired pattern on a surface of the transparent conductor layer, and thereafter removing unnecessary portions of the transparent conductive layer by immersion into hydrochloric acid.

The adhesive layer is formed on the transparent film to embed the transparent electrode pattern. A material forming the adhesive layer is preferably an acrylic adhesive agent, since it has a high transparency. Preferably, the acrylic adhesive agent has a thickness of 10 μm to 200 μm. A commercially available optical clear adhesive (OCA) may be employed as the adhesive layer. Such an acrylic adhesive agent is available from, for example, Nitto Denko Corporation (product name: LUCIACS (Registered Trademark) CS9621T).

As has been described above, according to the present embodiment, the transparent film 5 is disposed between the antistatic layer 3 and the transparent electrode pattern 6, and the antistatic layer 3 has a surface resistance value of $1.0 \times 10^9$ to $1.0 \times 10^{11} \Omega/\square$. By making the surface resistance value of the antistatic layer 3 to be within the aforementioned range, charging of the polarizing film 2 due to static electricity or the like is suppressed. Further, the capacitive sensor 4 can accurately sense a change in the capacitance produced between the transparent electrode pattern 6 and the user's finger. Further, with such an arrangement, since the antistatic layer 3 does not come into contact with the adhesive layer 7, it is possible to prevent the antistatic agent contained in the antistatic layer 3 from diffusing into the adhesive layer 7, and an antistatic function of the antistatic layer 3 is maintained for a long period of time. Therefore, it is possible to prevent occurrence of the malfunctioning while providing an improved visibility and also prevent a display defect for a long period of time by exerting an improved antistatic property.

In the foregoing, the film sensor of the present embodiment has been described. However, the present invention is not limited to the embodiment described above, and various modifications and alternations are conceivable based on the technical idea of the invention.

Hereinafter, examples of the invention will be described.

EXAMPLES

Example 1

First, an indium tin oxide was deposited through a sputtering method on one side of a polycycloolefin film (ZEON CORPORATION, product name "ZEONOR (registered trademark)") having a thickness of 50 μm to form a transparent conductive film consisting of amorphous indium tin oxide and having a thickness of 20 nm. This transparent conductive film was subject to a heating treatment for 30 minutes in a heating oven at 140° C., and the amorphous film was changed into a crystalline film. A photo-resist film having a striped pattern was formed on a surface of a transparent conductive film consisting of a crystalline film of indium tin oxide, and thereafter, the unnecessary portion of the transparent conductive film was removed by immersing the transparent conductive film in hydrochloric acid and a transparent electrode pattern was obtained. Then, a capacitive sensor was fabricated by laminating an acrylic adhesive layer (Nitto Denko Corporation, product name "LUCIACS (Registered Trademark)") on one side of the polycycloolefin film in such a manner that the transparent electrode pattern is embedded.

Then, a film sensor was obtained by laminating an antistatic layer having a surface resistance value of $2.0 \times 10^9 \Omega/\square$ and a polarizing film (Nitto Denko Corporation, product name: NPF (Registered Trademark)) on top of each other on the other side of the polycycloolefin film of the capacitive sensor (on a side opposite to the transparent electrode pattern). As the antistatic layer, there was used an acrylic pressure sensitive adhesive agent, in which bis(trifluoromethanesulfonyl)imide lithium was dispersed at 7 weight % against the total weight of the antistatic layer.

The film sensor fabricated in the aforementioned manner was used as a touch sensor of a surface capacitive type touch panel having a liquid crystal panel of an in-plane switching type.

Example 2

An input display apparatus was fabricated that has a structure similar to that of Example 1, except that an antistatic layer having a surface resistance value of $8.0 \times 10^{10} \Omega/\square$ was used. An acrylic pressure sensitive adhesive agent (thickness of 25 μm), in which bis(trifluoromethanesulfonyl)imide lithium is dispersed at 2 weight % against the total weight of the antistatic layer was used as the antistatic layer.

Comparative Example 1

An input display apparatus was fabricated that has a structure similar to that of Example 1, except that an antistatic layer having a surface resistance value of $5.0 \times 10^8 \Omega/\square$ was used. An acrylic pressure sensitive adhesive agent (thickness of 25 μm) in which bis(trifluoromethanesulfonyl)imide lithium is dispersed at 10 weight % against the total weight of the antistatic layer was used as the antistatic layer.

Comparative Example 2

An input display apparatus was fabricated that has a structure similar to that of Example 1, except that an antistatic layer having a surface resistance value of $2.0 \times 10^{11} \Omega/\square$ was used. An acrylic pressure sensitive adhesive agent (thickness of 25 μm) in which bis(trifluoromethanesulfonyl)imide lithium is dispersed at 1 weight % against the total weight of the antistatic layer was used as the antistatic layer.

Method of Evaluating Display Defect

Using an electrostatic discharge gun, static electricity was applied to a polarizing film disposed on a viewing-side surface of the touch panel, and a visual observation was carried out to determine whether there was any display defect.

Method of Evaluating Malfunctioning

Visual observation was carried out in a state where the touch panel of Examples 1, 2 and Comparative Examples 1, 2 were in use to determine whether there was any malfunctioning.

Results obtained by the aforementioned evaluation methods are indicated in Table 1. In Table 1, a case where a display defect did not occur is indicated with "○" and a case where a display defect occurred is indicated with "x".

TABLE 1

| | SURFACE RESISTANCE VALUE OF ANTISTATIC LAYER (Ω/□) | ANTISTATIC AGENT CONTENT (WEIGHT %) | MALFUNCTIONING | ANTISTATIC PROPERTY (DISPLAY DEFECT) | DETERMINATION |
|---|---|---|---|---|---|
| COMPARATIVE EXAMPLE 1 | $5.0 \times 10^8$ | 10 | YES | ○ | x (NG) |

TABLE 1-continued

|  | SURFACE RESISTANCE VALUE OF ANTISTATIC LAYER (Ω/□) | ANTISTATIC AGENT CONTENT (WEIGHT %) | MALFUNC-TIONING | ANTISTATIC PROPERTY (DISPLAY DEFECT) | DETER-MINATION |
|---|---|---|---|---|---|
| EXAMPLE 1 | $2.0 \times 10^9$ | 7 | NO | ○ | ○ (OK) |
| EXAMPLE 2 | $8.0 \times 10^{10}$ | 2 | NO | ○ | ○ (OK) |
| COMPARATIVE EXAMPLE 2 | $2.0 \times 10^{11}$ | 1 | NO | x | x (NG) |

Referring to the results in Table 1, as can be seen in Examples 1 and 2, with the film sensor using an antistatic layer having a surface resistance value per unit area of $2.0 \times 10^9$ to $8.0 \times 10^{10} \Omega/\square$, even if the polarizing film was charged by static electricity, a display defect was not produced in the liquid crystal panel. Also, malfunctioning of the capacitive sensor did not occur.

On the other hand, as can be seen in Comparative Examples 1 and 2, in a case where the surface resistance value was less than $1.0 \times 10^9 \Omega/\square$, malfunctioning of the capacitive sensor occurred. Further, when the surface resistance value of the antistatic layer has exceeded $1.0 \times 10^{11} \Omega/\square$, a display defect of the liquid crystal panel occurred. Based on the results of these Examples and Comparative Examples, it is estimated that the relationship between the surface resistance value and each of the malfunctioning and the display defect is as shown in FIG. 2.

Therefore, with the configuration of the film sensor of the invention, it was found that occurrence of the display defect can be prevented while preventing occurrence of the malfunctioning by setting the surface resistance value per unit area to $1.0 \times 10^9$ to $1.0 \times 10^{11} \Omega/\square$, and more specifically to $2.0 \times 10^9$ to $8.0 \times 10^{10} \Omega/\square$.

[Industrial Applicability]

The film sensor of the invention has no particular limitation for its application, and preferably, it can be employed in portable terminals such as smart phones or tablet terminals (also referred to as Slate PCs).

What is claimed is:

1. A film sensor comprising:
a polarizing film, an antistatic layer and a capacitive sensor that are laminated in this order,
the capacitive sensor having a transparent film, a transparent electrode pattern formed at one side of the transparent film, and an adhesive layer formed at the one side of the transparent film to embed the transparent electrode pattern,
the transparent film being disposed between the antistatic layer and the transparent electrode pattern,
the antistatic layer having a surface resistance value of $1.0 \times 10^9$ to $1.0 \times 10^{11} \Omega/\square$.

2. The film sensor according to claim 1, wherein the antistatic layer and the adhesive layer are disposed at a predetermined interval with the transparent film being interposed between the antistatic layer and the adhesive layer.

3. The film sensor according to claim 1, wherein, after the adhesive layer has been formed at the one side of the transparent film, the antistatic layer is formed at the other side of the transparent film.

4. The film sensor according to claim 1, wherein the antistatic layer includes any one of a surface active agent, an alkaline metal salt, a polyhydric alcohol, a conductive fine particle and a conductive polymer.

5. The film sensor according to claim 4, wherein the alkaline metal salt is bis(trifluoroalkanesulfonyl)imide alkaline metal salt.

* * * * *